United States Patent [19]

Montefusco et al.

[11] 3,882,486

[45] May 6, 1975

[54] VARIABLE-FREQUENCY GENERATOR

[75] Inventors: Nicola Montefusco; Alfredo Barlucchi, both of Milan, Italy

[73] Assignee: Societa Italiana Telecomunicazioni Siemens S.p.A., Milan, Italy

[22] Filed: Oct. 9, 1973

[21] Appl. No.: 404,749

[30] Foreign Application Priority Data

Oct. 6, 1972 Italy ................................ 30148/72

[52] U.S. Cl. ........... 340/347 DA; 328/181; 328/185

[51] Int. Cl. ........................................... H03k 4/06

[58] Field of Search .......... 340/347 DA; 328/27, 34, 328/36, 181, 185; 235/197

[56] References Cited

UNITED STATES PATENTS

| | | | |
|---|---|---|---|
| 3,350,651 | 10/1967 | Davis | 328/181 |
| 3,541,349 | 11/1970 | Bright et al. | 328/181 X |
| 3,617,769 | 11/1971 | Hanson | 328/181 X |
| 3,641,566 | 2/1972 | Konrad et al. | 340/347 DA |
| 3,657,657 | 4/1972 | Jefferson | 235/197 X |
| 3,676,698 | 7/1972 | Hunter | 328/185 X |
| 3,713,137 | 1/1973 | Stone | 340/347 DA |
| 3,743,951 | 7/1973 | Carroll | 328/181 |

*Primary Examiner*—Malcolm A. Morrison
*Assistant Examiner*—Jerry Smith
*Attorney, Agent, or Firm*—Karl F. Ross; Herbert Dubno

[57] ABSTRACT

A frequency wobbler comprises a reversible binary counter to which a train of stepping pulses is continuously fed under the control of a first bistable switch applying these pulses to a forward-counting input thereof until the count surpasses a predetermined upper limit whereupon they are applied to a backward-counting input until the count drops below a predetermined lower limit, and so forth. The oscillating digital output of the counter is converted into a stepped analog voltage which is integrated, over an interval substantially smaller than a pulse-repetition period, into a sloping voltage under the control of a second bistable switch reversing its slope upon the attainment of a predetermined upper or lower level. The resulting triangular wave, varying in its fundamental frequency according to the instantaneous magnitude of the generating analog voltage, can be used to produce square or sine waves of like frequency variation.

8 Claims, 3 Drawing Figures

PATENTED MAY 6 1975 3,882,486

SHEET 2

VARIABLE-FREQUENCY GENERATOR

FIELD OF THE INVENTION

Our present invention relates to a variable-frequency generator designed to produce an oscillation, of sinusoidal or other wave shape, whose frequency is periodically and linearly changed or "wobbled" between an upper and a lower limit. Frequency wobblers of this character are used to measure such parameters as attenuation and phase shifts throughout a band of frequencies transmitted through a network or other test object.

BACKGROUND OF THE INVENTION

Conventional systems of this type use electromechanical means for periodically varying the tuning of an oscillator in order to carry out a frequency sweep at a rate which is low compared with the mean frequency of the test band. Such systems are relatively bulky and incompatible with present-day trends toward miniaturization.

OBJECTS OF THE INVENTION

The general object of our present invention is to provide a compact, purely electronic frequency wobbler adapted to operate in a wide range of frequencies, from a few hertz to hundreds of kilohertz or therebeyond.

A more particular object is to provide means in such a system for conveniently varying the limits of the sweep and/or the sweep rate.

It is also an object of our invention to provide a system of this description having a nearly sinusoidal output with minimum harmonics content.

SUMMARY OF THE INVENTION

The foregoing objects are realized, in accordance with our present invention, by the provision of a binary counter having a forward-counting first input and a backward-counting second input, the counter being stepped by a pulse train advantageously generated by an adjustable frequency divider in the output of a fixed-frequency oscillator. A first bistable switching circuit, responsive to the counter output, feeds these stepping pulses to the forward-counting input until the count exceeds a predetermined upper limit; it then feeds these pulses to the backward-counting input until the count drops below a predetermined lower limit, and so forth with switchover from one counter input to the other upon the passing of either of these two numerical limits. The counter works into a digital/analog converter which translates its oscillating count into an alternately rising and falling stepped voltage, the latter being applied to a voltage integrator of small time constant (compared with the repetition period of the stepping pulses) by means of a second bistable switching circuit which periodically reverses the polarity of that stepped voltage in response to attainment of either of two predetermined voltage levels by the integrator output. In this way, the integrator produces a substantially triangular voltage wave whose frequency varies with the instantaneous magnitude of its stepped input voltage and which can be converted into an oscillation of like frequency but different wave shape, e.g. square or sinusoidal.

According to a more particular feature of our invention, each of the bistable switching circuits comprises two voltage comparators working into a setting input and a resetting input, respectively, of an associated flip-flop. Each of the comparators of the first switching circuit has one input connected to the counter output and another input to a respective source of reference potential; each comparator of the second switching circuit has one input connected to the integrator output and another input likewise connected to a source of reference potential. Preferably, all these sources are independently adjustable to vary the upper and lower limits of the count and the top and bottom levels of the triangular voltage wave, i.e. the amplitude of that wave and of any of its derivatives. Adjustment of the frequency divider generating the stepping pulses varies the sweep rate within the limits of the band established by the two first-mentioned sources of reference potential. Since the latter reference potentials are a measure of the minimum and maximum frequencies of the test band, the magnitudes of these limiting frequencies can be ascertained with the aid of a frequency indicator in the integrator output if the input of the integrator is switched from the counter output to a pair of terminals (one at a time) carrying the potentials referred to.

In order to convert the triangular voltage wave into a substantially sinusoidal one, we may insert a harmonics suppressor in the output circuit of the integrator. A particularly effective device of this kind has an exponential transformation characteristic which in its initial segment approximates a sine wave so that near-complete suppression of higher harmonics can be achieved thereby; the residual harmonics content can be reduced in this manner to a fraction of a percent in terms of the energy of the fundamental.

BRIEF DESCRIPTION OF THE DRAWING

The above and other features of our invention will now be described in detail hereinafter with reference to the accompanying drawing in which.

SPECIFIC DESCRIPTION

Figure 1:
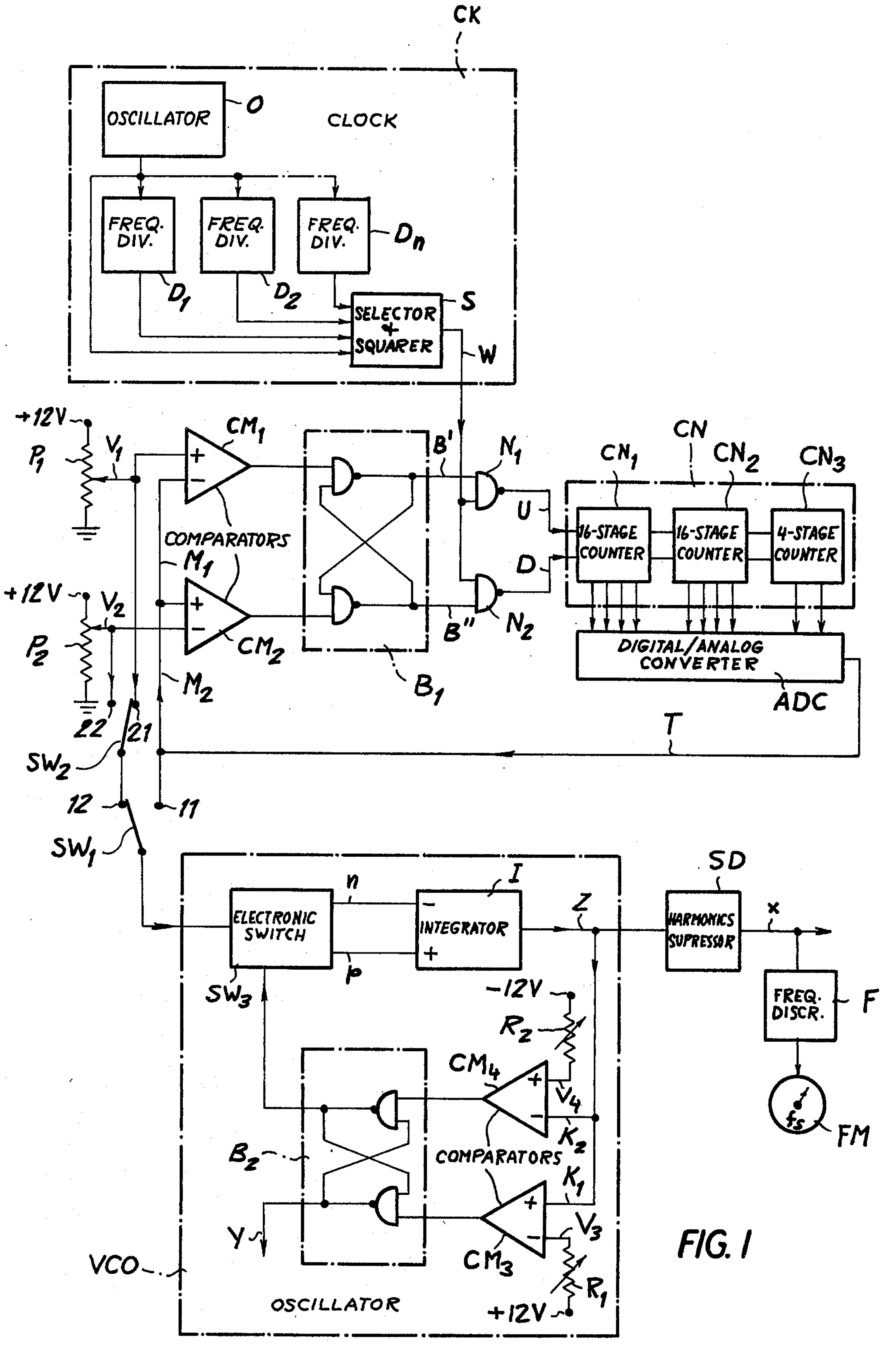
FIG. 1 is a block diagram illustrating a frequency wobbler according to our invention.

In FIG. 1 we have shown a clock circuit CK generating a train of uniformly spaced stepping pulses on an output lead W of a selector and squarer S which has a multiplicity of inputs energized by a stabilized local oscillator O, preferably of the crystal-controlled type, and by the several stage outputs of a multistage frequency divider $D_1, D_2 \ldots D_n$ connected to the same oscilllator. Selector S may be manually operated to combine the outputs of different divider stages in order to generate a pulse train of a desired repetition frequency or cadence. Reference in this connection may be made to commonly owned U.S.. Pat. No.. 3,649,923, in the name of Piero Venturini, describing a system for synthesizing pulse trains of different cadences with the aid of such divider stages.

The pulses on output W are fed in parallel to respective inputs of a pair of coincidence (here NAND) gates $N_1$, $N_2$ whose other inputs are alternately energized by a set output B′ and a reset output B″ of an associated flip-flop $B_1$. The setting and resetting inputs of this flip-flop are connected to the outputs of two voltage comparators $CM_1$ and $CM_2$, respectively; two sources of reference potential $V_1$ and $V_2$, here shown as a pair of potentiometers $P_1$ and $P_2$ connected between ground and a terminal of +12 V, work into an additive input of comparator $CM_1$ and a subtractive input of comparator $CM_2$. A subtractive input $M_1$ of comparator $CM_1$ and an additive input $M_2$ of comparator $CM_2$ are tied to an output T of a digital/analog converter ADC connected to receive the reading of a reversible binary counter CN here shown to consist of three multistage sections in cascade, namely two 16-stage sections $CN_1$, $CN_2$ and a four-stage section $CN_3$. Counter CN has an input U for forward counting, tied to the output of NAND gate $N_1$, and an input D for backward counting, tied to the output of NAND gate $N_2$.

Output lead T of converter ADC terminates at a bank contact 11 of a manual switch $SW_1$ in the input of an electronic switch $SW_3$ which forms part of a voltage-wave generator VCO; in its illustrated position, switch $SW_1$ stands on another bank contact 12 leading to another manual switch $SW_2$ whose bank contacts 21 and 22 are connected to the sliders of potentiometers $P_1$ and $P_2$, respectively, to receive therefrom the selected reference potentials $V_1$ and $V_2$. Thus, the tandem-connected switches $SW_1$ and $SW_2$ may be selectively operated to apply either one or the other of these reference potentials or, alternatively, the converter output voltage to switch $SW_3$ which transmits its input voltage with the original polarity (here assumed to be positive) to a first output lead p in one of its operating positions and with inverted polarity (negative) to a second output lead n in an alternate position. The two leads p and n terminate at respective inputs of an integrator I whose time constant is small compared with the mean repetition period of the stepping pulses on output lead W. As a result, an output lead Z of integrator I carries a voltage changing at a substantially faster rate than the analog voltage on output lead T of converter ADC. Thus, the output voltage of integrator I has an ascending slope upon the energization of its input lead p with a substantially constant positive voltage and has a descending slope upon a similar but negative energization of its input lead p.

Lead Z is connected to respective inputs $K_1$ (additive) and $K_2$ (substractive) of a pair of voltage comparators $CM_3$ and $CM_4$ which, together with an associated flip-flop $B_2$, form part of a switching circuit similar to that constituted by comparators $CM_1$, $CM_2$ and flip-flop $B_1$. Comparator $CM_3$ has a subtractive input connected to a source of variable reference potential $V_3$ represented by an adjustable resistor $R_1$ and a terminal of +12 V; comparator $CM_4$ has an additive input connected to a similar source of reference potential $V_4$ represented by an adjustable resistor $R_2$ and a terminal of −12 V. One of the outputs of flip-flop $B_2$ controls the switch $SW_3$, causing it to emit negative voltages on lead p when the flip-flop $B_2$ is set (comparator $CM_3$ conducting) and positive voltages on lead n when the flip-flop is reset (comparator $CM_4$ conducting).

A harmonics suppressor SD is connected to integrator output lead Z and has an output lead X extending to a nonillustrated load. Also connected to the latter lead is a frequency discriminator F which works into a meter FM calibrated in terms of sweep frequency $f_s$.

Figure 2:
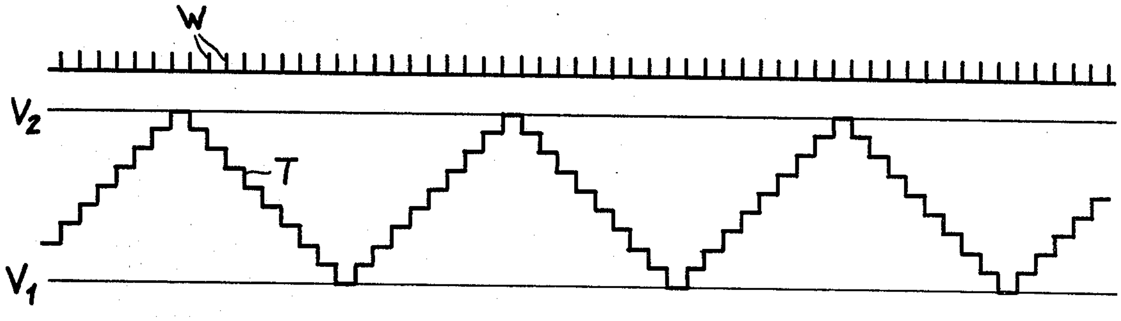
FIGS. 2 and 3 are two sets of graphs used for explaining the operation of the system of FIG. 1.
Figure 3:
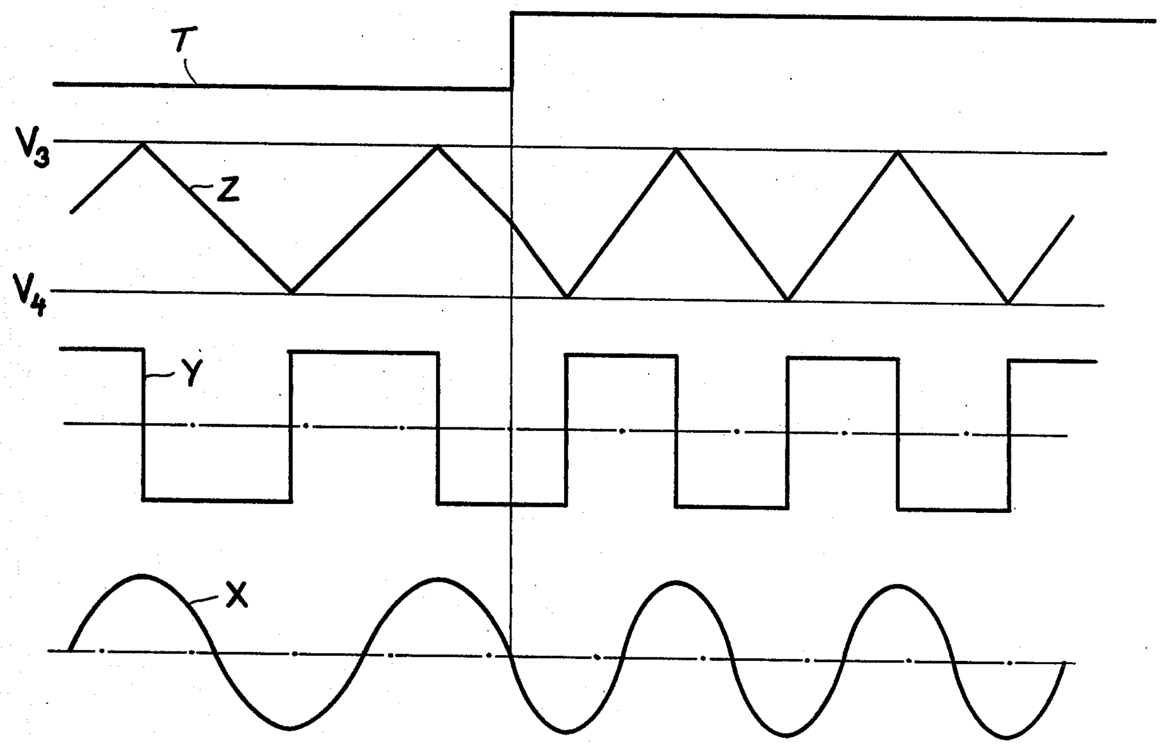

We shall now describe the operation of the system of FIG. 1 with reference to FIGS. 2 and 3.

In FIG. 2 the graph W represents the stepping pulses appearing on the output lead so designated in FIG. 1. At the beginning of operations, with counter CN assumed to be cleared, converter ADC transmits zero voltage to comparator inputs $M_1$ and $M_2$. This results in the conduction of comparator $CM_1$ which sets the flip-flop $B_1$ and opens the NAND gate $N_1$ to the stepping pulses W for a rising count of component CN, thereby causing the appearance of a stepped output voltage T (FIG. 2) on the lead so designated in FIG. 1 the steps of this voltage being of uniform width and height. The advance of the counter CN continues until that output voltage reaches and slightly surpasses the reference potential $V_2$ selected with the aid of potentiometer $P_2$. At that instant comparator $CM_2$ conducts and resets the flip-flop $B_1$ whereby the stepping pulses W are switched from forward-counting input U to backward-counting input D through the conduction of NAND gate $N_2$ in lieu of its mate $N_1$. The stepped voltage T thereupon descends to a value just beneath its lower limit $V_1$ at which point the comparator $CM_1$ again takes over and restores the initial condition.

In FIG. 3 we have shown, on an expanded time scale, one of the steps of voltage T in the output of converter ADC. With switch $SW_1$ assumed to stand on its contact 11, integrator I generates a positive-going output voltage Z if flip-flop $B_2$ happens to be reset by the comparator $CM_4$. As soon as voltage Z rises above the reference potential $V_3$ selected with the aid of variable resistor $R_1$, comparator $CM_3$ conducts and sets the flip-flop $B_2$ whereupon the energization of lead n by switch $SW_3$ reverses the slope of voltage Z. When the absolute value of this now negative-going voltage exceeds that of the reference potential $V_4$ selected by means of variable resistor $R_2$, comparator $CM_4$ again resets the flip-flop $B_2$ to start another cycle of the triangular wave Z.

Flip-flop $B_2$ has another output Y carrying a square wave of the same frequency as the substantially triangular voltage wave Z, as also shown in FIG. 3. The bottom graph of that Figure illustrates a sine wave X derived from wave Z by the harmonics suppressor SD which may have an exponential characteristic as discussed above.

In the illustrated positions of switches $SW_1$ and $SW_2$, reference potential $V_1$ appears in the input of electronic switch $SW_3$. This means that the frequency of triangular wave Z (and of its derivatives X and Y) is constant at its minimum value $f_{min}$ determined by potential $V_1$; this value can therefore be read on the indicator FM. In an analogous manner, reversal of switch $SW_2$ enables a reading of the maximum frequency $f_{max}$ of the test band. With these two frequency limits established, a reversal of switch $SW_1$ causes the frequency of wave Z to vary periodically between $f_{min}$ and $f_{max}$ at a rate determined by the setting of selector S in stepping-pulse generator CK.

We claim:

1. A system for producing a periodically and linearly varying frequency, comprising:

a generator of uniformly spaced stepping pulses;

a binary counter provided with a forward-counting first input and with a backward-counting second input;

first bistable switch means responsive to the output of said counter for feeding said stepping pulses to said first input until the count exceeds a predetermined upper limit and to said second input until the count drops below lower predetermined dlower limit, with switchover from one to the other upon the passing of either of said limits;

a digital/analog converter connected to the output of said counter for translating said count into an alternately rising and falling stepped voltage with steps of uniform width and height;

a voltage integrator having a small time constant with reference to the repetition period of said stepping pulses; and second bistable switch means for feeding said stepped voltage to said integrator with periodic polarity reversals in response to attainment of either of two predetermined voltage levels by the integrator output, thereby producing a substantially triangular wave whose frequency varies with the instantaneous magnitude of said stepped voltage.

2. A system as defined in claim 1 wherein each of said bistable switch means comprises a flip-flop with a setting input and a resetting input, a first voltage comparator working into said setting input, and a second voltage comparator working into said resetting input; the comparators of said first switch means having each one input connected to the counter output and another input connected to a first and a second source of reference potential respectively; the comparators of said second switch means having each one input connected to the integrator output and another input connected to a third and a fourth source of reference potential, respectively.

3. A system as defined in claim 2 wherein said sources of reference potential are adjustable for varying said limits and said levels.

4. A system as defined in claim 3, further comprising indicator means for the frequency of said triangular wave connected to the integrator output.

5. A system as defined in claim 4, further comprising selector means operable to feed the potentials of said first and second sources to said second switch means in lieu of said stepped voltage.

6. A system as defined in claim 1, further comprising harmonics-suppressor means connected to the integrator output for deriving a substantially sinusoidal wave from said substantially triangular wave.

7. A system as defined in claim 1 wherein said second switch means is provided with an ancillary output for delivering a square wave at the frequency of said substantially triangular wave.

8. A system as defined in claim 1 wherein said generator comprises a fixed-frequency oscillator and frequency-divider means connected to said oscillator for producing said stepping pulses, said frequency-divider means being adjustable to vary the repetition frequency of said stepping pulses.

* * * * *